US008102923B2

(12) United States Patent
Gorokhov et al.

(10) Patent No.: US 8,102,923 B2
(45) Date of Patent: Jan. 24, 2012

(54) HIERARCHICAL CODING FOR MULTICAST MESSAGES

(75) Inventors: Alexei Gorokhov, San Diego, CA (US); Avneesh Agrawal, San Diego, CA (US); Arvind Vijay Keerthi, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 869 days.

(21) Appl. No.: 11/567,014

(22) Filed: Dec. 5, 2006

(65) Prior Publication Data

US 2007/0147539 A1 Jun. 28, 2007

Related U.S. Application Data

(60) Provisional application No. 60/742,678, filed on Dec. 5, 2005, provisional application No. 60/774,789, filed on Feb. 17, 2006.

(51) Int. Cl.
*H04B 14/04* (2006.01)

(52) U.S. Cl. ........ 375/242; 375/295; 375/260; 375/299; 375/267; 714/794; 714/795

(58) Field of Classification Search .......... 375/295, 375/260, 299, 267; 714/794, 795
See application file for complete search history.

(56) References Cited

U.S. PATENT DOCUMENTS

| | | | | |
|---|---|---|---|---|
| 5,852,630 A * | 12/1998 | Langberg et al. | ............. | 375/219 |
| 6,014,411 A * | 1/2000 | Wang | ............................. | 375/259 |
| 6,084,636 A * | 7/2000 | Sugahara et al. | ........ | 375/240.03 |
| 6,088,387 A * | 7/2000 | Gelblum et al. | .............. | 375/222 |
| 6,131,180 A * | 10/2000 | Ramesh | ........................ | 714/790 |
| 6,505,320 B1 * | 1/2003 | Turk et al. | ...................... | 714/755 |
| 6,553,540 B1 * | 4/2003 | Schramm et al. | ............. | 714/790 |
| 6,611,513 B1 * | 8/2003 | ten Brink | ....................... | 370/342 |
| 6,658,605 B1 * | 12/2003 | Yoshida et al. | ............... | 714/702 |
| 7,073,116 B1 * | 7/2006 | Settle et al. | .................... | 714/786 |
| 2001/0045900 A1 * | 11/2001 | Murayama et al. | ............. | 341/94 |

(Continued)

FOREIGN PATENT DOCUMENTS

DE 4425713 C1 4/1995

(Continued)

OTHER PUBLICATIONS

International Search Report—PCT/US06/061628—International Search Authority, European Patent Office—Aug. 21, 2008.

(Continued)

*Primary Examiner* — Kenneth Lam
(74) *Attorney, Agent, or Firm* — Dmitry R. Milikovsky; Howard H. Seo (57) ABSTRACT

Techniques for sending signaling information using hierarchical coding are described. With hierarchical coding, individual messages for users are encoded using multiple interconnected encoders such that (1) the message for each user is sent at a data rate suitable for that user and (2) a single multicast message is generated for the messages for all users. A base station determines data rates supported by the users and the code rates to achieve these data rates. Each data rate is determined by one or more code rates. Signaling information for the users is mapped to data blocks to be sent at different data rates. Each data block is then encoded in accordance with the code rate(s) associated with the data rate for that data block. A final coded block is generated for all users and transmitted. Each user performs the complementary decoding to recover the message sent to that user.

23 Claims, 10 Drawing Sheets

U.S. PATENT DOCUMENTS

| | | | | |
|---|---|---|---|---|
| 2002/0166091 | A1* | 11/2002 | Kidorf et al. | 714/752 |
| 2003/0102990 | A1* | 6/2003 | Tsang | 341/59 |
| 2006/0034381 | A1* | 2/2006 | Ionescu et al. | 375/267 |
| 2006/0159195 | A1* | 7/2006 | Ionescu et al. | 375/267 |

FOREIGN PATENT DOCUMENTS

| | | |
|---|---|---|
| EP | 1065855 A1 | 1/2001 |
| EP | 1387545 | 2/2004 |
| JP | 2002532955 A | 10/2002 |
| KR | 20040035297 | 4/2004 |

OTHER PUBLICATIONS

Written Opinion—PCT/US06/061628—International Search Authority, European Patent Office—Aug. 21, 2008.

Clark G.C., et al., "Error Correction Coding for Digitai Communications, System Applications," Error Correction Coding for Digital Communications, New York, Plenum Press, US, Jan. 1, 1981, pp. 331-341.

Luby, M. et al., "Request for Comments: 34553: The Use of Forward Error Correction (FEC) in Reliable Multicast," Internet Article, [Online] Dec. 2002.

Zhu, Ying, et al., "Multicast with Coding in Application-Layer Overlay Networks." Internet Article, Jan. 2004.

International Preliminary Report on Patentability, PCT/US2006/061628, The International Bureau of WIPO, Geneva, Switzerland, Feb. 9, 2008.

Ban De Deek, J et. al. "Benefit of Modulation Diversity in Turbo Coded-OFDM Systems", Vehicular Technology Conference, 2004 VTC-Spring Conference, IEEE 59th, vol. 2, pp. 929-933, May 17-19, 2004.

Final Research Report, "A study on adaptive video transmission technology using layered coding" (Nov. 1998).

"Performance of Channel Estimation Using Pilot Symbols for a Coherent OFDM System" International Symposium on Wireless Personal Multimedia Communications, vol. 2 (Nov. 12, 2000).

Taiwanese Search report—095145260—TIPO—Oct. 26, 2010.

* cited by examiner

HIERARCHICAL CODING FOR MULTICAST MESSAGES

The present application claims priority to provisional U.S. Application Ser. No. 60/742,678, entitled "Hierarchical Coding for Multicast Control Messages," filed Dec. 5, 2005 and U.S. Application Ser. No. 60/774,789, entitled "Hierarchical Coding For Multicast Messages," filed Feb. 17, 2006, and assigned to the assignee hereof and incorporated herein by reference.

BACKGROUND

I. Field

The present disclosure relates generally to communication, and more specifically to techniques for encoding and decoding data.

II. Background

A multiple-access communication system can support communication for multiple users by sharing the available system resources. The resources allocated to the users are dependent on the multiple-access scheme implemented by the system. For example, the system may allocate resources on the basis of time, frequency, code space, and/or transmit power. A user may establish a link with the system by sending an access request to the system and receiving an access grant with the allocated resources. The user may then communicate with the system via the established link.

A multiple-access system typically reserves some resources for transmission of signaling to the users. The signaling may be for various types of information needed for proper system operation, such as access grants. The signaling is often sent on a signaling channel, which may also be called an overhead channel, a control channel, or a broadcast channel.

A signaling channel is typically sent as either a unicast channel or a broadcast channel. For a unicast signaling channel, signaling messages for individual users are encoded separately and then sent on the signaling channel specifically to these users. Encoding each message separately results in poor coding efficiency. For a broadcast signaling channel, messages for all users are encoded together and then sent on the signaling channel to all users. Encoding all messages together improves coding efficiency. However, the broadcast signaling channel is typically operated in a manner such that all users, including the user with the worst channel conditions, can reliably decode this signaling channel. This may be achieved by using a low code rate and/or high transmit power for the broadcast signaling channel. Operating the broadcast signaling channel to satisfy the worst-case user often results in inefficient use of the resources allocated for the signaling channel.

There is therefore a need in the art for techniques to more efficiently transmit signaling messages in a multiple-access system.

SUMMARY

Techniques for efficiently sending signaling and/or other information using hierarchical coding are described herein. With hierarchical coding, individual messages for users may be encoded using multiple interconnected encoders such that (1) the message for each user may be sent at a data rate suitable for that user and (2) a single multicast message may be generated for the messages for all users. Hierarchical coding may be implemented with various coding architectures such as a parallel architecture, a serial architecture, and a mixed architecture.

In an embodiment, a transmitter (e.g., a base station) determines data rates supported by the users, e.g., based on channel state information for the users. The transmitter also determines code rates to achieve the data rates for the users, e.g., based on a parallel or serial hierarchical coding architecture. Each data rate is determined by one or more code rates. Signaling information for the users is mapped to blocks of input data. Each input data block is sent at a different data rate and is encoded in accordance with the code rate(s) associated with that data rate. In an embodiment, first input data (e.g., from one block) is encoded in accordance with a first code rate to generate first coded data. Second input data (e.g., from another block) and the first coded data are then jointly or separately encoded in accordance with a second code rate to generate second coded data. The remaining input data is encoded, possibly with coded data, in accordance with one or more code rates. Final coded data is generated for all users and is further processed and transmitted. Each user performs the complementary decoding to recover the message sent to that user.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout.

DETAILED DESCRIPTION

The word "exemplary" is used herein to mean "serving as an example, instance, or illustration." Any embodiment or design described herein as "exemplary" is not necessarily to be construed as preferred or advantageous over other embodiments or designs.

Figure 1:
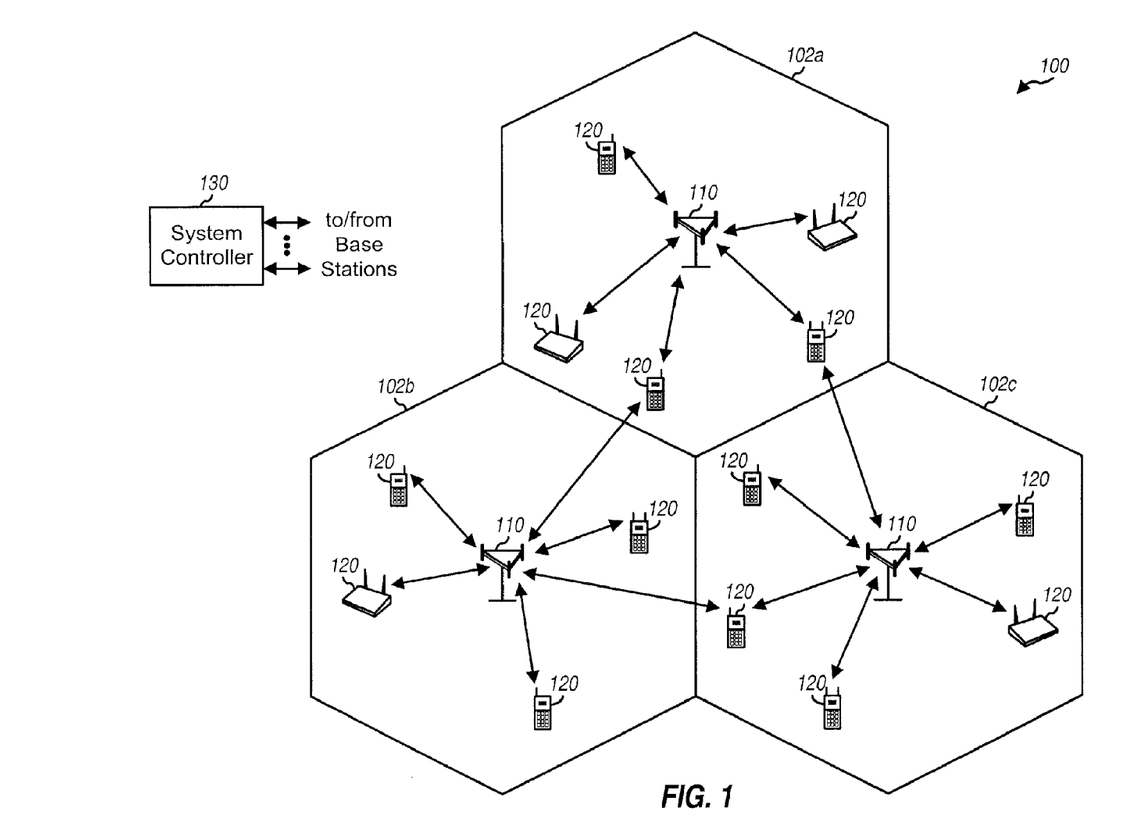
FIG. 1 shows a wireless multiple-access communication system.

FIG. 1 shows a wireless multiple-access communication system 100 with multiple base stations 110 and multiple terminals 120. A base station is a station that communicates with the terminals. A base station may also be called, and may contain some or all of the functionality of, an access point, a Node B, base transceiver subsystem (BTS) and/or some other network entity. Each base station 110 provides communication coverage for a particular geographic area 102.

Terminals 120 are typically dispersed throughout the system, and each terminal may be fixed or mobile. A terminal may also be called, and may contain some or all of the functionality of, a mobile station, a user equipment, and/or some other device. A terminal may be a wireless device, a cellular phone, a personal digital assistant (PDA), a wireless modem card, and so on. In the following description, the terms "terminal" and "user" are used interchangeably.

For a centralized architecture, a system controller 130 couples to base stations 110 and provides coordination and control for these base stations. System controller 130 may be a single network entity or a collection of network entities. For a distributed architecture, base stations 110 may communicate with one another as needed without the uses of system controller 130.

The coding techniques described herein may be used for various multiple-access communication systems such as Code Division Multiple Access (CDMA) systems, Time Division Multiple Access (TDMA) systems, Frequency Division Multiple Access (FDMA) systems, Orthogonal FDMA (OFDMA) systems, Single-Carrier FDMA (SC-FDMA) systems, Spatial Division Multiple Access (SDMA) systems, and so on. An OFDMA system utilizes Orthogonal Frequency Division Multiplexing (OFDM). An SC-FDMA system utilizes Single-Carrier Frequency Division Multiplexing (SC-FDM). OFDM and SC-FDM partition a frequency band (e.g., the overall system bandwidth) into multiple (K) orthogonal subcarriers, which are also called tones, bins, and so on. Each subcarrier may be modulated with data. In general, modulation symbols are sent in the frequency domain with OFDM and in the time domain with SC-FDM.

Figure 2:
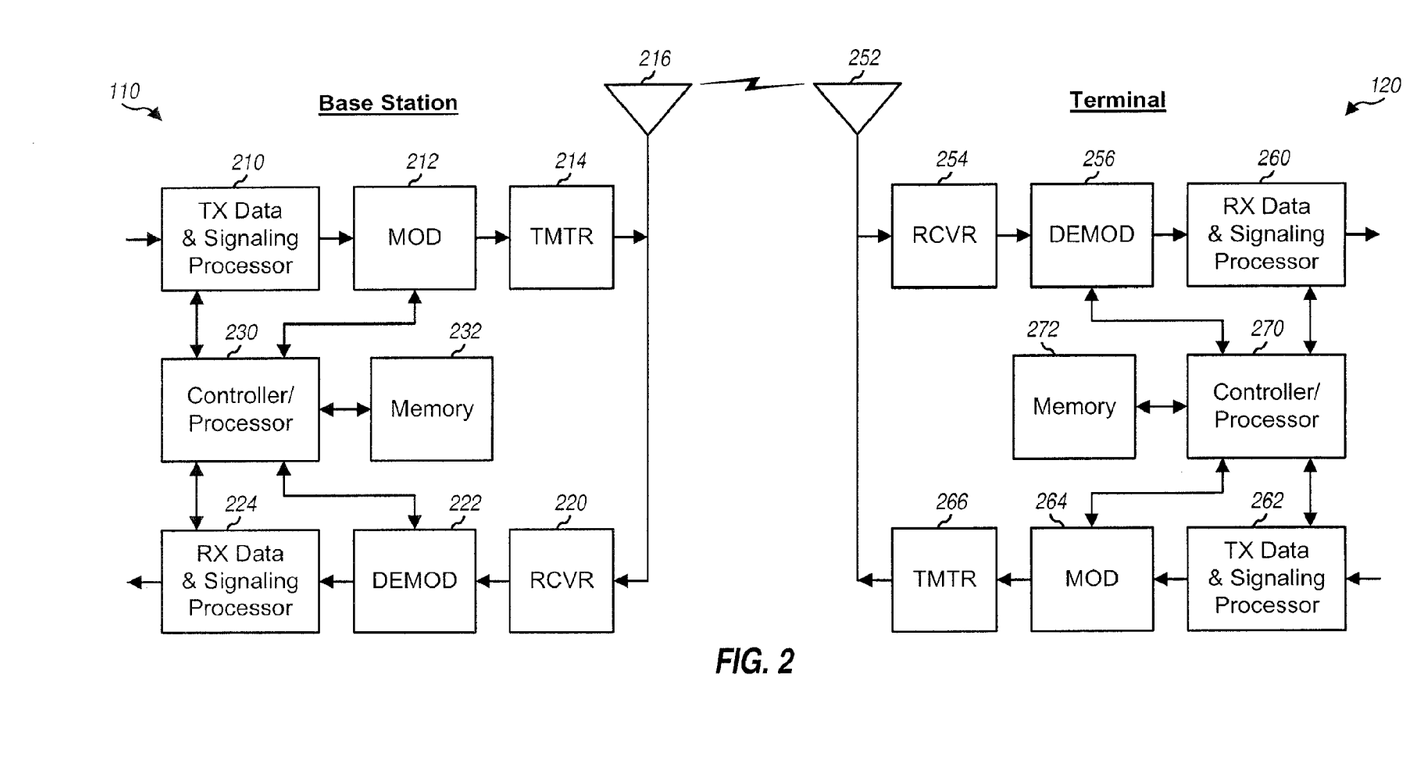
FIG. 2 shows a block diagram of a base station and a terminal.

FIG. 2 shows a block diagram of an embodiment of a base station 110 and a terminal 120 in FIG. 1. At base station 110, a transmit (TX) data and signaling processor 210 receives traffic data for one or more terminals, processes (e.g., formats, encodes, interleaves, and symbol maps) the traffic data for each terminal in accordance with one or more packet formats selected for that terminal, and provides data symbols. Processor 210 also receives signaling for the terminals, processes the signaling as described below, and provides signaling symbols. Processor 210 also generates pilot symbols. As used herein, a data symbol is a symbol for traffic data, a signaling symbol is a symbol for signaling, a pilot symbol is a symbol for pilot, which is data that is known a priori by the base station and the terminals, and a symbol is generally a complex value. A modulator (MOD) 212 performs modulation on the data, signaling and pilot symbols and generates output chips. Modulator 212 may perform modulation for OFDM, SC-FDM, CDMA, and so on. Hence, the output chips may be for OFDM symbols, SC-FDM symbols, and/or spectrally spread data. A transmitter (TMTR) 214 conditions (e.g., converts to analog, filters, amplifies, and upconverts) the output chips and generates a forward link signal, which is transmitted from an antenna 216.

At terminal 120, an antenna 252 receives the forward link signals from base station 110 and possibly other base stations and provides a received signal to a receiver (RCVR) 254. Receiver 254 processes (e.g., conditions and digitizes) the received signal and provides input samples. A demodulator (DEMOD) 254 performs demodulation on the input samples and provides symbol estimates, which are estimates of the data and signaling symbols sent by base station 110 to terminal 120. A receiver (RX) data and signaling processor 260 processes (e.g., symbol demaps, deinterleaves, and decodes) the symbol estimates and provides decoded data and signaling for terminal 120.

On the reverse link, at terminal 120, traffic data and signaling to be sent to base station 110 are processed by a TX data and signaling processor 262, modulated by a modulator 264, conditioned by a transmitter 266, and transmitted from antenna 252. At base station 110, the reverse link signals from terminal 120 and other terminals are received by antenna 216, conditioned and digitized by a receiver 220, demodulated by a demodulator 222, and processed by an RX data and signaling processor 224 to recover the traffic data and signaling sent by the terminals.

Controllers/processors 230 and 270 direct the operation of various processing units at base station 110 and terminal 120, respectively. Memories 232 and 272 store program codes and data for base station 110 and terminal 120, respectively.

A base station may send signaling messages to terminals or users within its coverage area. These signaling messages may be sent for various purposes such as allocation and/or de-allocation of resources, acknowledgements (ACKs) and/or negative acknowledgements (NAKs) for data packets received from the users, power control information, and so on.

Each user may be located anywhere within the base station coverage area and may achieve a particular received signal quality for a transmission from the base station. The received signal quality may be quantified by a signal-to-noise ratio (SNR), a signal-to-noise-and-interference ratio (SNIR), an energy-per-symbol-to-total-noise ratio (Ec/Io), and so on. The base station may send messages to each user at a suitable data rate to allow the user to reliably receive the messages. A data rate may also be referred to as a packet format, a transmission rate, a rate, and so on.

The data rate for a message sent to a user may be expressed as:

$$R_i = C_i \cdot S_i \cdot f_{sym}, \qquad \text{Eq (1)}$$

where $C_i$ is a code rate used for the message sent to user i,
$S_i$ is the spectral efficiency of the modulation scheme used for user i,
$f_{sym}$ is the symbol rate applicable for user i, and
$R_i$ is the data rate for user i.

Code rate $C_i$ determines the number of code bits generated by an encoder for a given number of information bits. For example, a code rate of $C_i = 5/8$ means that eight code bits are generated by the encoder for every five information bits. A lower code rate generates more redundancy, is more robust against adverse channel conditions, but has lower efficiency due to more code bits being sent for a given number of information bits. The converse is true for a higher code rate.

Spectral efficiency $S_i$ indicates the number of code bits sent in each modulation symbol. $S_i$ is determined by the modulation scheme selected for use. For example, $S_i$ is equal to 1.0 for BPSK, 2.0 for QPSK, 3.0 for 8-PSK, 4.0 for 16-QAM, and so on. If the same modulation scheme and symbol rate are used for all users, then $S_i$ and $f_{sym}$ are fixed, and the data rate $R_i$ for each user may be obtained by selecting an appropriate code rate $C_i$.

The data rates for the users may be determined, e.g., based on channel state information available for these users. Multiple users may have the same data rate, and the messages for these users may be encoded in the same manner. The unique data rates for all users may be identified and ordered in a decreasing order as follows:

$$R_3 > R_2 > R_3 > \ldots > R_N, \quad \text{Eq (2)}$$

where $R_1$ is the highest data rate and $R_N$ is the lowest data rate. As noted above, a given data rate may be applicable for multiple users.

The messages for the users may be encoded using multiple interconnected encoders such that (1) the message for each user is encoded at a suitable overall code rate that achieves the data rate for that user and (2) a single coded message is generated for the messages for all users. The encoding may be performed using various coding architectures such as a parallel architecture, a serial or cascaded architecture, and a mixed architecture. A coding architecture may also be referred to as a coding structure, a coding scheme, and so on.

Figure 3A:
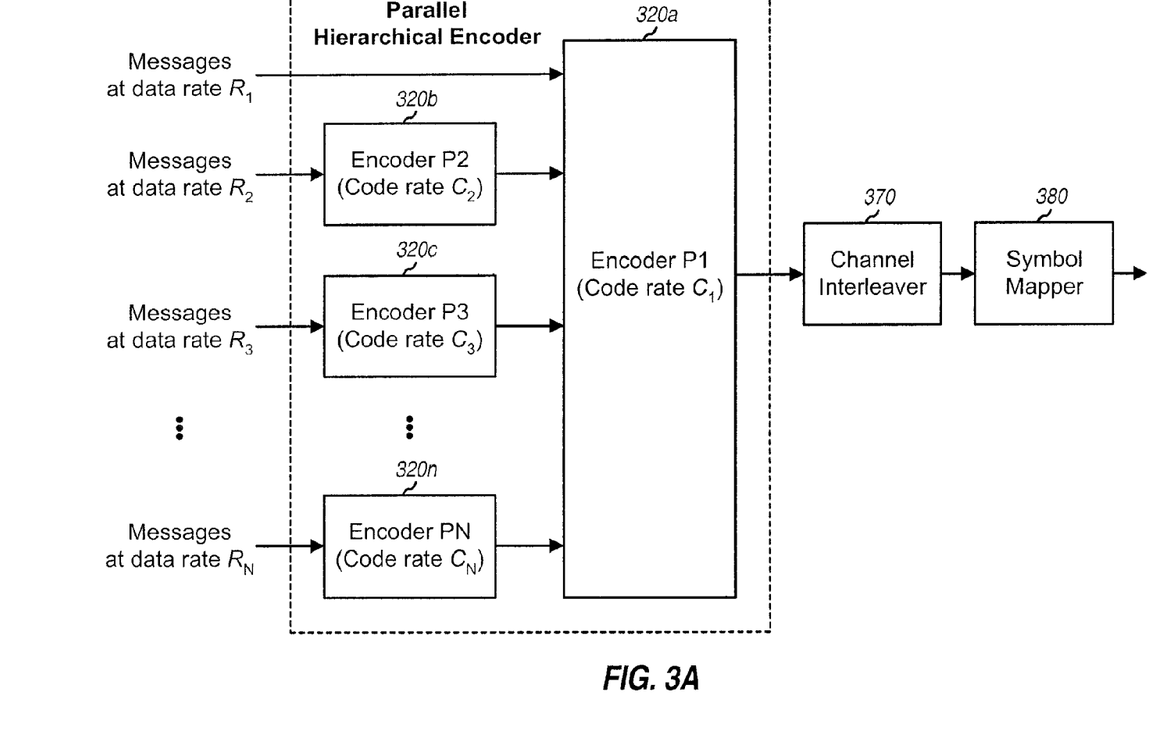
FIG. 3A shows a hierarchical encoder for the parallel architecture.

FIG. 3A shows an embodiment of a hierarchical encoder 310 for the parallel architecture. In this embodiment, messages to be sent at the highest data rate of $R_1$ are provided to an encoder 320a, messages to be sent at the second highest data rate of $R_2$ are provided to an encoder 320b, messages to be sent at the third highest data rate of $R_3$ are provided to an encoder 320c, and so on, and messages to be sent at the lowest data rate of $R_N$ are provided to an encoder 320n. Encoders 320b through 320n are coupled in parallel and provide their outputs to encoder 320a. A channel interleaver 370 receives the code bits from encoder 320a and interleaves or reorders these code bits in accordance with an interleaving scheme to provide time and/or frequency diversity. A symbol mapper 380 maps the interleaved bits to modulation symbols in accordance with a modulation scheme selected for use.

Each encoder 320 multiplexes its input messages, encodes the multiplexed messages in accordance with a code rate selected for that encoder, and provides one or more coded messages. A coded message may also be called a coded block, a codeword, a coded packet, a code bit sequence, and so on. A message may be of any size. Each encoder 320 essentially maps a set of input bits to a set of output bits based on a specific mapping designed to provide good performance. Each encoder 320 may (a) jointly encode all input messages and provide one coded message, (b) separately encode each input message and provide a corresponding coded message, or (c) jointly encode some input messages and separately encode other input message(s).

Encoder 320a encodes its input messages with a code rate of $C_1$, which is selected to achieve the highest data rate of $R_1$ with the modulation scheme used by symbol mapper 380. The code rate for encoder 320a may be expressed as:

$$C_1 = Q \cdot R_1, \quad \text{Eq (3)}$$

where $Q = 1/(S \cdot f_{sym})$. In equation (3), Q is a constant that is determined by the symbol rate $f_{sym}$ and the spectral efficiency S of the modulation scheme used by symbol mapper 380. Encoder 320b encodes its input messages with a code rate of $C_2 = R_2/R_1$, which is selected such that the combination of code rates $C_1$ and $C_2$ achieves the second highest data rate of $R_2$, or $C_1 \cdot C_2 = Q \cdot R_2$.

In general, for the parallel architecture, encoder 320 for messages to be sent at a data rate of $R_i$ encodes its input messages with a code rate of $C_i$, which may be determined as follows:

$$C_i = R_i/R_1, \text{ for } i = 2, \ldots, N. \quad \text{Eq (4)}$$

The combination of code rates $C_1$ and $C_i$ achieves the data rate of $R_i$, which may be given as:

$$C_1 \cdot C_i = Q \cdot R_i, \text{ for } i = 2, \ldots, N. \quad \text{Eq (5)}$$

Figure 3B:
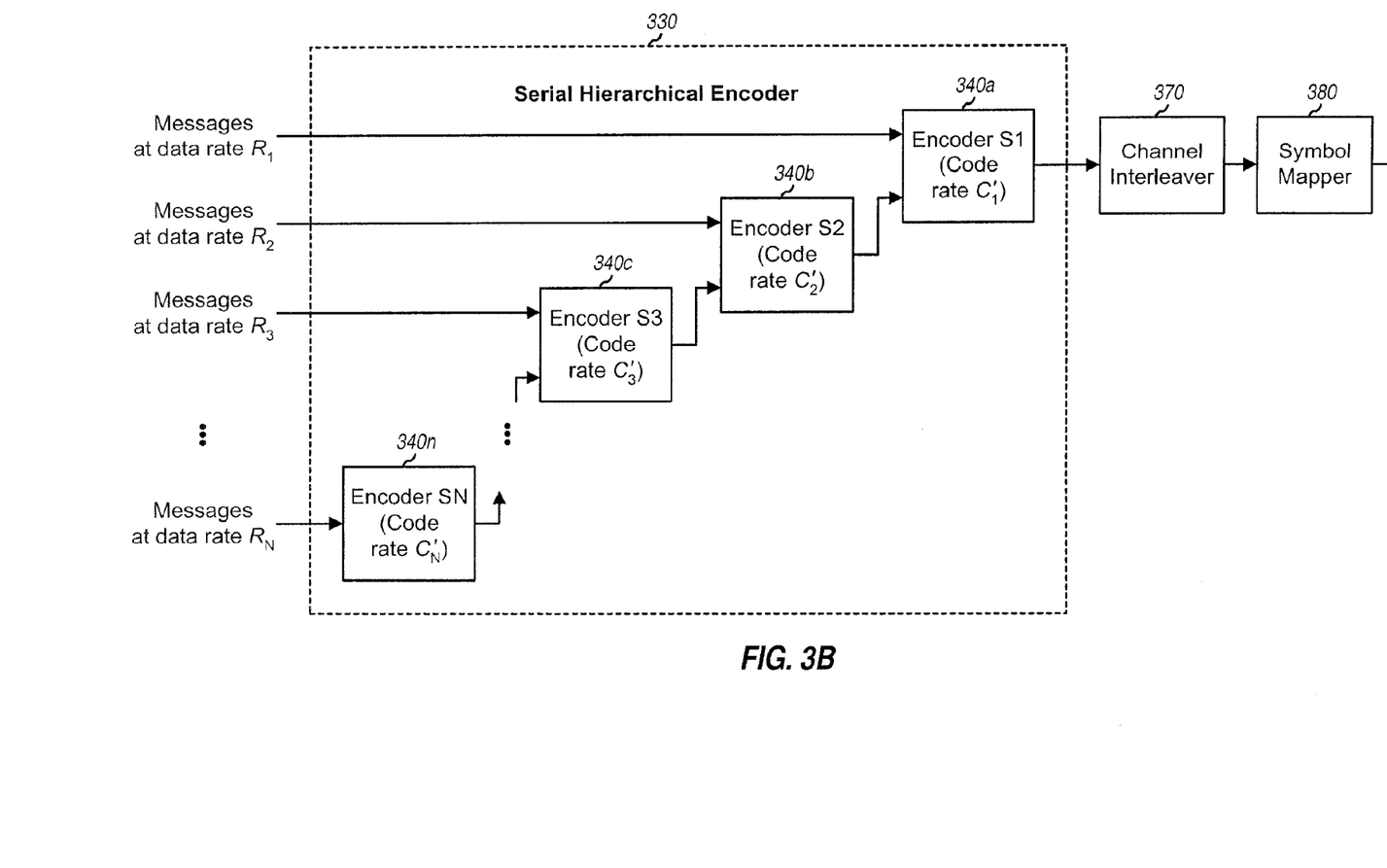
FIG. 3B shows a hierarchical encoder for the serial architecture.

FIG. 3B shows an embodiment of a hierarchical encoder 330 for the serial architecture. In this embodiment, messages to be sent at the highest data rate of $R_1$ are provided to an encoder 340a, messages to be sent at the second highest data rate of $R_2$ are provided to an encoder 340b, messages to be sent at the third highest data rate of $R_3$ are provided to an encoder 340c, and so on, and messages to be sent at the lowest data rate of $R_N$ are provided to an encoder 340n. Encoders 340a through 340n are coupled in series. Each encoder 340, except for the first encoder 340a, provides its output to a subsequent encoder. Each encoder 340, except for the last encoder 340n, also receives the output of a prior encoder. Channel interleaver 370 interleaves the code bits from encoder 340a. Symbol mapper 380 maps the interleaved bits to modulation symbols in accordance with the selected modulation scheme.

Each encoder 340 multiplexes its input messages, encodes the multiplexed messages in accordance with a code rate selected for that encoder, and provides one or more coded messages. Each encoder 340 may jointly encode all input messages and provide one coded message, separately encode each input message and provide a corresponding coded message, or jointly encode some input messages and separately encode other input message(s). Encoder 340a encodes its input messages with a code rate of $C_1'$, which may be determined as $C_1' = Q \cdot R_1$. Encoder 340b encodes its input messages with a code rate of $C_2' = R_2/R_1$, which is selected such that the combination of code rates $C_1'$ and $C_2'$ achieves the second highest data rate of $R_2$, or $C_1' \cdot C_2' = Q \cdot R_2$. Encoders 340a and 340b in FIG. 3B are coupled in the same manner as encoders 320a and 320b in FIG. 3A. Hence, $C_1' = C_1$ and $C_2' = C_2$. Encoder 340c encodes its input messages with a code rate of $C_3' = R_3/R_2$, which is selected such that the combination of code rates $C_1'$, $C_2'$ and $C_3'$ achieves the third highest data rate of $R_3$, or $C_1' \cdot C_2' \cdot C_3' = Q \cdot R_3$.

In general, for the serial architecture, encoder 340 for messages to be sent at a data rate of $R_i$ encodes its input messages with a code rate of $C_i'$, which may be determined as follows:

$$C_i' = R_i/R_{i-1}, \text{ for } i = 2, \ldots, N. \quad \text{Eq (6)}$$

The combination of code rates $C_1'$ through $C_k'$ achieves the data rate of $R_i$, which may be given as:

$$\prod_{j=1}^{i} C_j' = Q \cdot R_i, \text{ for } i = 2, \ldots, N, \quad \text{Eq (7)}$$

where "$\Pi$" denotes a product operation.

Figure 3C:
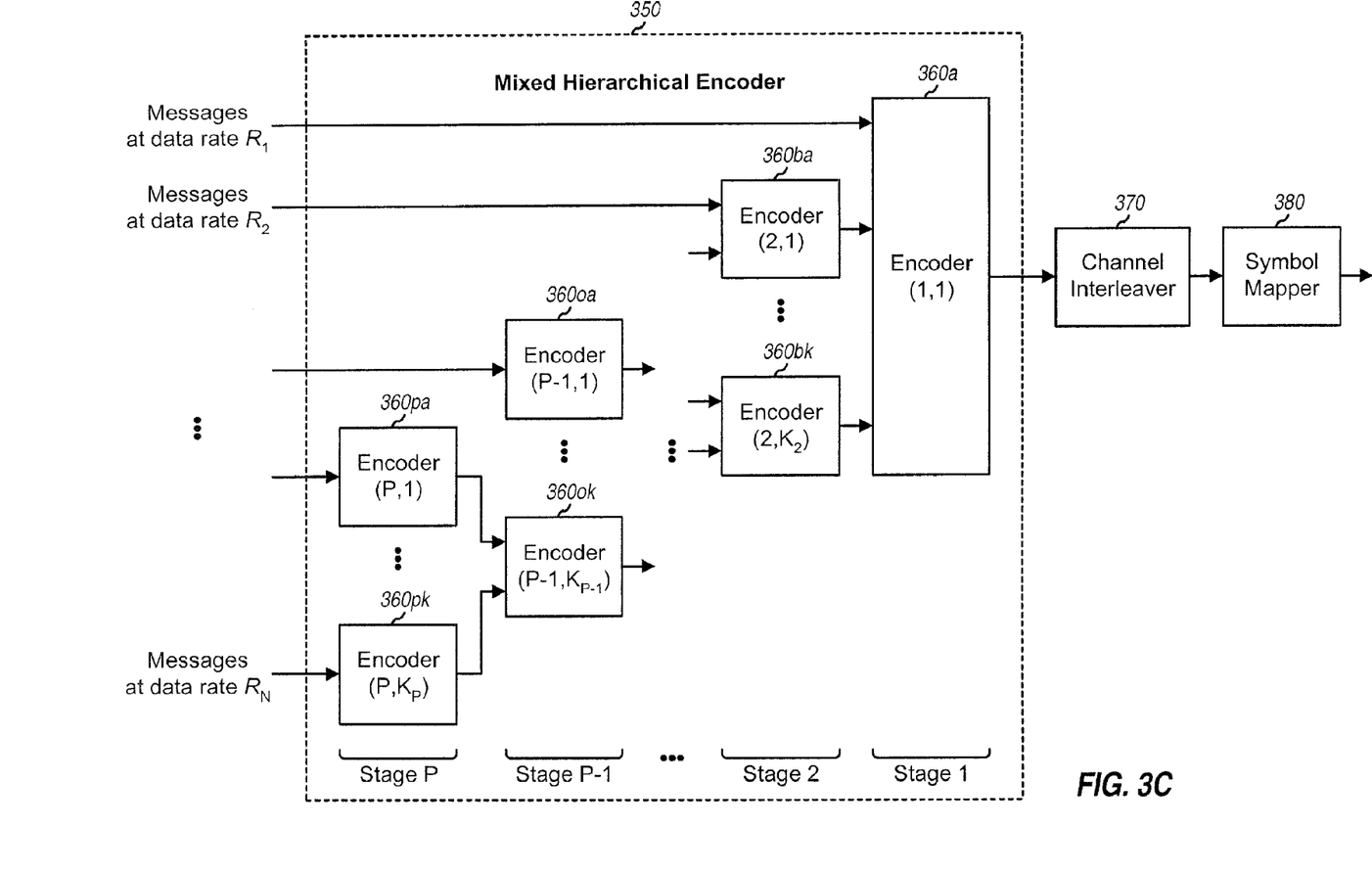
FIG. 3C shows a hierarchical encoder for the mixed architecture.

FIG. 3C shows an embodiment of a hierarchical encoder 350 for the mixed architecture. In this embodiment, hierarchical encoder 350 includes P stages of encoders 360, where in general $P \geq 2$. Each stage may also be referred to as a layer, a round, and so on. Each stage, except for the first stage, may include one or more encoders 360. Stage p, for $p = 1, \ldots, P$, includes $K_p$ encoders 360, where $K_p$ is the number of encoders in stage p and in general $K_p \geq 1$. In FIG. 3C, encoder (p, q) denotes the q-th encoder in stage p, where $p = 1, \ldots, P$ and $q = 1, \ldots, K_p$.

In the embodiment shown in FIG. 3C, messages to be sent at the highest data rate of $R_1$ are provided to an encoder 360a in the first stage, messages to be sent at the second highest data rate of $R_2$ are provided to the first encoder 360ba in the second stage, and so on, and messages to be sent at the lowest data rate of $R_N$ are provided to the last encoder 360pk in the last stage P. In general, the messages for each data rate may be provided to any encoder in any stage. Each encoder 360, except for encoder 360a in the first stage, provides its output to an encoder in a subsequent stage, which may be one or multiple stages over. Each encoder 360, except for encoders 360pa through 360pk in the last stage, also receives the output of at least one encoder in at least one prior stage. Channel interleaver 370 interleaves the code bits from encoder 360a. Symbol mapper 380 maps the interleaved bits to modulation symbols.

Each encoder 360 multiplexes its input messages, encodes the multiplexed messages in accordance with a code rate selected for that encoder, and provides one or more coded messages. Each encoder 360 may jointly encode all input messages and provide one coded message, separately encode each input message and provide a corresponding coded message, or jointly encode some input messages and separately encode other input message(s). Encoder 360a encodes its input messages with a code rate of $C_1$, which may be determined as $C_1 = Q \cdot R_1$. Encoder 360ba encodes its input messages with a code rate of $C_2 = R_2/R_1$, which is selected such that the combination of code rates $C_1$ and $C_2$ achieves the second highest data rate of $R_2$, or $C_1 \cdot C_2 = Q \cdot R_2$.

The messages to be sent at the third highest data rate of $R_3$ may be encoded in one of several manners. In one embodiment, these messages are provided to a second encoder in the second stage (e.g., encoder 360bk in FIG. 3C, assuming that $K_2 = 2$), which encodes its input messages with a code rate of $C_3 = R_3/R_1$. In another embodiment, these messages are provided to an encoder in the third stage (not shown in FIG. 3C), which encodes its input messages with a code rate of $C_3' = R_3/R_2$ and provides its output to encoder 360ba in the second stage. The messages for each remaining data rate of $R_i$, for $i = 4, \ldots, N$, may likewise be encoded in one of several manners. The messages to be sent at data rate $R_i$ may be provided to another encoder in the same stage as the encoder used for messages sent at data rate of $R_{i-1}$. Alternatively, these messages may be provided to an encoder in the next stage.

In general, the messages for each data rate may be provided to any encoder in any stage. The messages for each data rate may be encoded by one or more encoders in one or more stages.

Hierarchical encoder 350 may implement hierarchical encoder 310 in FIG. 3A or hierarchical encoder 330 in FIG. 3B. If $P = 2$ and $K_2 = N - 1$, then hierarchical encoder 350 includes two stages, with the second stage including N−1 encoders. Hierarchical encoder 350 is then equivalent to hierarchical encoder 310 in FIG. 3A. If $P = N$ and $K_2 = \ldots = K_P = 1$, then hierarchical encoder 350 includes N stages, with each stage including one encoder. Hierarchical encoder 350 is then equivalent to hierarchical encoder 330 in FIG. 3B. A mixed architecture with more than two stages and multiple encoders in at least one stage may offer more flexibility in choosing the code rates for the different encoders.

Encoders 320a, 340a and 360a in FIGS. 3A, 3B and 3C, respectively, have the same code rate of $C_1$ and may be implemented with the same or similar designs.

Figure 6A:
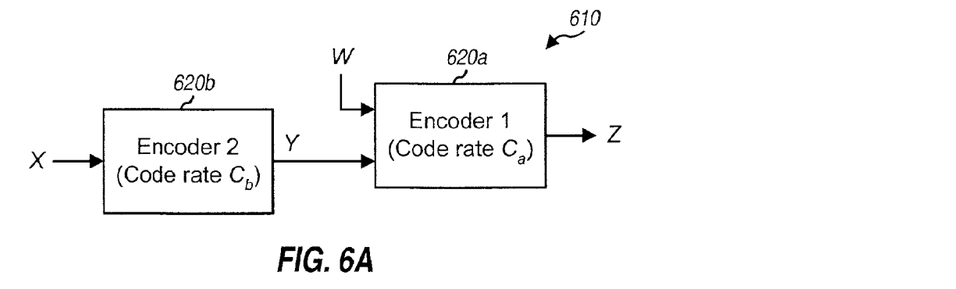
FIG. 6A shows a 2-stage hierarchical encoder.

Hierarchical encoders 310, 330 and 350 form different nested or hierarchical coding architectures. In general, a hierarchical coding architecture is characterized by at least two encoders coupled in a manner to support at least two data rates. The simplest hierarchical encoder may include two encoders for two stages, as shown in FIG. 6A, with the encoder in the second stage providing its output to the encoder in the first stage. Different data rates may be achieved with different encoder sets, with each set including at least one encoder.

Equations (1) through (7) describe data rates and code rates for the hierarchical encoders in FIGS. 3A, 3B and 3C when input messages to each encoder are encoded separately. Different equations may be applicable for the hierarchical encoders when the input messages to each encoder are jointly encoded. The equations for joint encoding may have additional parameters, e.g., for the relative sizes of different input messages being jointly encoded.

Figure 4:
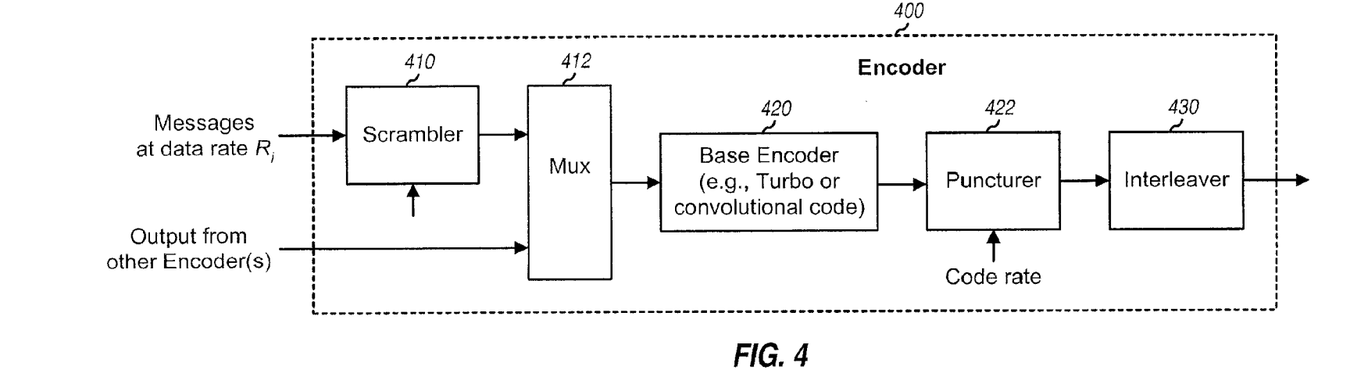
FIG. 4 shows an encoder within a hierarchical encoder.

FIG. 4 shows a block diagram of an embodiment of an encoder 400, which may be used for each of encoders 320, 340 and 360 in FIGS. 3A, 3B and 3C, respectively. Encoder 400 receives messages to be sent at data rate $R_i$. Encoder 400 may also receive the output from one or more other encoders in one or more prior stages for messages to be sent at data rates lower than $R_i$.

Within encoder 400, a scrambler 410 receives the messages to be sent at data rate $R_i$ and scrambles the message for each user with a scrambling code for that user. User-specific scrambling may be applied to isolate the contents of different users that are encoded together at the base station and subsequently decoded together at each recipient user. The scrambling may be omitted if isolation of user messages is not needed. A multiplexer 412 multiplexes the output of scrambler 410 and the coded messages from other encoder(s) and provides an input bit sequence for encoding.

In the embodiment shown in FIG. 4, the input bits are encoded with a fixed base code, and the resultant code bits are punctured with an appropriate puncturing pattern to achieve the desired code rate. A base encoder 420 encodes the input bits with the fixed base code, which may be a convolutional code, a serial-concatentated Turbo code, a parallel-concatentated Turbo code, and so on. The base code may have a fixed code rate (e.g., a code rate of ½ or ⅓) and may generate a predetermined number of code bits for a given input bit sequence length. A puncturing unit 422 receives the code bits from base encoder 420, punctures or deletes selected ones of the code bits, and provides punctured or undeleted code bits. The puncturing is performed in accordance with a puncturing pattern that is selected based on the code rate for encoder 400. An interleaver 430 receives the punctured code bits, interleaves these bits in accordance with an interleaving scheme, and provides the interleaved bits as the code bits for either the next stage or the output of the hierarchical encoder. Interleaver 430 may also be omitted, and the interleaving may be performed by channel interleaver 370 in FIGS. 3A through 3C.

FIG. 4 shows an embodiment of an encoder that may be used in a hierarchical encoder. Encoders of other designs may also be used in a hierarchical encoder. In another embodiment, base encoder 420 may be a block encoder that maps a block of input bits into a block of output bits based on a block code such as a Reed-Solomon code, a low density parity check (LDPC) code, and so on. In other embodiments, scrambler 410 may be omitted, interleaver 430 may be omitted, other processing blocks may be included, and so on.

The base station performs hierarchical coding on the individual messages for different users, generates a single multicast message for these users, and transmits the multicast message to the user. A multicast message is a message sent to multiple users and may also be referred to as a broadcast message. The users receive the multicast message and perform the complementary decoding to recover their individual messages. For a message sent at the highest data rate of $R_1$ and encoded by a single encoder 320a, 340a or 360a, this message may be recovered by performing decoding for this single encoder and extracting the message of interest. For a message sent at a data rate lower than $R_1$ and encoded by multiple encoders, this hierarchical coded message may be recovered by performing decoding for each of the encoders used for that message and extracting the message of interest. The decoding of a hierarchical coded message may be performed in various manners.

Figure 5:
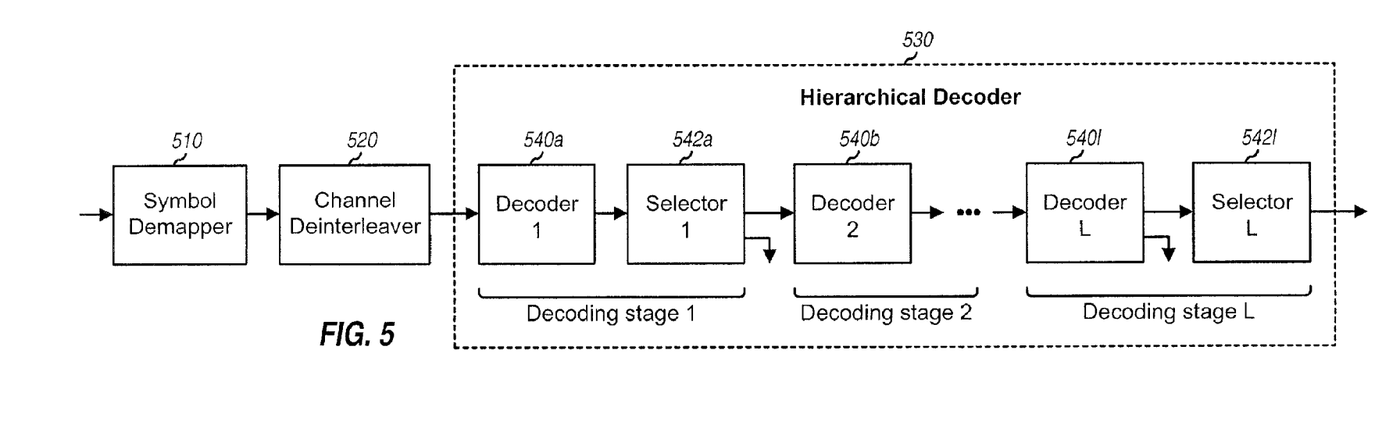
FIG. 5 shows a sequential hierarchical decoder.

FIG. 5 shows a block diagram of an embodiment of a hierarchical decoder 530 that performs sequential decoding for a hierarchical coded message M. A symbol demapper 510 receives symbol estimates from demodulator 256 in FIG. 2, performs symbol demapping of the symbol estimates, and provides demapped symbols, e.g., in the form of log-likelihood ratios (LLRs). A channel deinterleaver 520 deinterleaves the demapped symbols in a manner complementary to the interleaving performed by channel interleaver 370. Channel deinterleaver 520 provides the deinterleaved symbols as input symbols for hierarchical decoder 530.

In the embodiment shown in FIG. 5, hierarchical decoder 530 includes L decoding stages for the L coding stages observed by message M, where $L \geq 2$. Each decoding stage includes a decoder 540 and a selector 542. In the first decoding stage, decoder 540a decodes the input symbols in a manner complementary to the encoding performed by the first encoder 320a, 340a or 360a and provides decoded symbols. Selector 542a selects the decoded symbols corresponding to the output of the encoder used for message M in the second stage and discards the other symbols. For example, if message M is encoded by encoder 360ba in FIG. 3C, then selector 542a retains the decoded symbols corresponding to the output of encoder 360ba. In each subsequent decoding stage l, decoder 540 for that stage receives symbols from selector 542 in prior stage l−1 and decodes these symbols in a manner complementary to the encoding performed by the encoder used for message M in stage l. Selector 542 for stage then selects the decoded symbols corresponding to the output of the encoder used for message M in stage l+1. Selector 542 for the last stage L provides the decoded data for message M.

In the embodiment shown in FIG. 5, the decoder in each stage l is determined by the encoder used for message M in stage l. The selector in each stage l extracts the desired symbols in a manner complementary to the multiplexing of input messages performed by the encoder in stage l.

In another embodiment, hierarchical coded message M is recovered by performing iterative decoding. With iterative decoding, the output of a decoder is fed back and used by another decoder in order to improve the reliability of the decoded symbols. In general, iterative decoding may be performed over all or a subset of the decoders applicable for message M. For clarity, iterative decoding is described below for a simple 2-stage hierarchical encoder.

FIG. 6A shows a 2-stage hierarchical encoder 610 composed of encoders 620a and 620b. Encoder 620b receives and encodes data block X in accordance with code rate $C_b$ and generates coded block Y. Encoder 620a receives coded block X and data block W to be sent at a higher data rate. Encoder 620a encodes blocks W and Y in accordance with code rate $C_a$ and generates coded block Z, which is further processed and transmitted. Encoders 620a and 620b may implement a serial concatenated convolutional code or some other code.

Figure 6B:
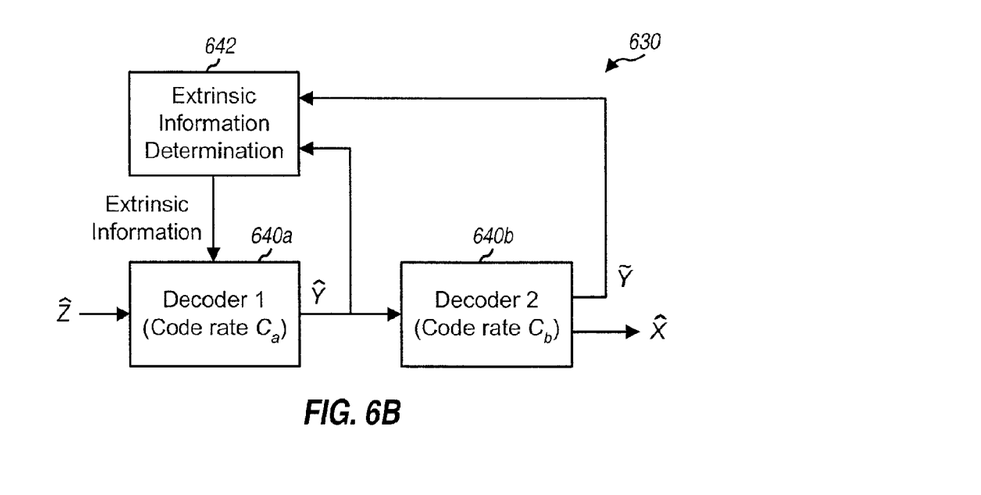
FIG. 6B shows an iterative hierarchical decoder.

FIG. 6B shows a hierarchical decoder 630 for hierarchical encoder 610 in FIG. 6A. Hierarchical decoder 630 receives input symbols $\hat{Z}$, which are initial estimates of the code bits Z from encoder 620a. The input symbols $\hat{Z}$ may be given in LLRs or some the form.

For the first iteration, a decoder 640a decodes the input symbols $\hat{Z}$ in accordance with code rate $C_a$ used by encoder 620a and provides decoded symbols $\hat{Y}$, which are initial estimates of the code bits Y from encoder 620b. A decoder 640b decodes symbols $\hat{Y}$ in accordance with code rate $C_b$ used by encoder 620b and provides decoded symbols $\hat{X}$, which are initial estimates of input bits X for encoder 620b. Decoder 640b also derives symbols $\tilde{Y}$, which are estimates of symbols $\hat{Y}$ from decoder 640a. A unit 642 computes the difference between symbols $\tilde{Y}$ and $\hat{Y}$ and provides the difference as extrinsic information to decoder 640a.

For each subsequent iteration, decoder 640a decodes input symbols $\hat{Z}$ and the extrinsic information from unit 642 in accordance with code rate $C_a$ and provides improved estimates of code bits Y from encoder 620b. Decoder 640b decodes symbols $\hat{Y}$ from decoder 640a in accordance with code rate $C_b$ and provides improved estimates of input bits X as well as improved estimates of symbols $\hat{Y}$ from decoder 640a. Unit 642 computes the difference between symbols $\tilde{Y}$ and $\hat{Y}$ and provides extrinsic information to decoder 640a. Any number of iterations may be performed. After completing the last iteration, decoder 640b provides a decoded block, which is a final estimate of the transmitted data block X.

In another embodiment, hierarchical coded message M is recovered by performing joint decoding. For a simple 2-stage hierarchical encoder, a first set of symbols may be defined for all of the inputs to the encoder used for message M in the second stage. A second set of symbols may be defined for all of the inputs to the encoder in the first stage except for the output of encoder used for message M in the second stage. For hierarchical encoder 610 shown in FIG. 6A, the first set of symbols may correspond to X, and the second set of symbols may correspond to W. Joint decoding may then be performed on the first and second sets of symbols to obtain an estimate of X. Joint decoding may also be performed for more than two encoders.

Joint decoding exploits the structure of all codes being jointly decoded, e.g., the codes used by encoders 620a and 620b in FIG. 6A. Joint decoding may be performed in several manners. In one embodiment, joint decoding is performed with maximal likelihood (ML) decoding. ML decoding examines all possible combinations of bits that might have been transmitted and identifies the bit combination that is mostly likely to have been transmitted based on all available information such as the input symbols, channel estimates, and so on. ML decoding is computationally intensive and may be prohibitive for many applications, especially for large data block sizes. In another embodiment, joint decoding is performed by decoding iteratively, e.g., as shown in FIG. 6B. It can be shown that optimal joint decoding, with an appropriate code design, is capable of achieving spectral efficiencies that match the capacities of the wireless channels between the base station and the different users, e.g., when the total available transmit power is distributed equally among these users.

The coding techniques described herein may be used to send user-specific messages to individual users, broadcast messages with different coverage areas, and so on. The user-specific messages may be for various types of signaling such as allocation and/or de-allocation of resources, ACKs and/or NAKs, power control information, and so on. The coding techniques may also be used with various signaling channel structures.

Figure 7:
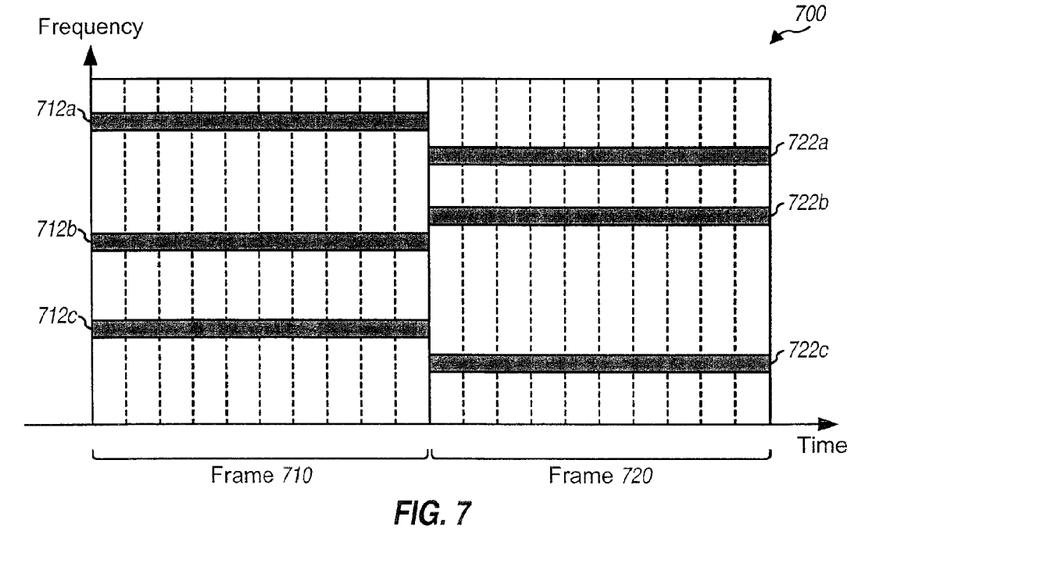
FIG. 7 shows a time-frequency diagram for a shared signaling channel.

FIG. 7 shows a time-frequency diagram 700 of an embodiment of a shared signaling channel (SSCH) that may be used to send multicast messages generated with hierarchical coding. In this embodiment, the system has multiple subcarriers that may be obtained with OFDM, SC-FDM, or some other modulation technique.

Time-frequency diagram 700 shows an exemplary mapping of the SSCH to subcarriers for two successive frames 710 and 720. Frames 710 and 720 may represent two successive frames in a frequency division duplexed (FDD) system. Frames 710 and 720 may also represent two successive frames for the forward link in a time division duplexed (TDD) system. In this case, one or more intervening frames for the reverse link may be located between frames 710 and 720 (not shown in FIG. 7). Frames 710 and 720 may each be of any duration.

The SSCH may be assigned subcarriers in various manners. In an embodiment, the SSCH is assigned specific subcarriers for the entire duration of a frame, and the subcarrier assignment may change at frame boundary. In the embodiment shown in FIG. 7, the SSCH is assigned three sets of subcarriers 712*a*, 712*b* and 712*c* in frame 710 and three sets of subcarriers 722*a*, 722*b* and 722*c* in frame 720. In another embodiment, the SSCH is assigned subcarriers that may change during the course of a frame. For all embodiments, the subcarriers assigned to the SSCH may be static or may be dynamically selected based on a predetermined pattern or a pseudo-random frequency-hopping pattern. Each pattern indicates the specific subcarriers to use for the SSCH in each time interval, which may span one or multiple symbol periods.

The SSCH may be allocated subcarriers in various manners. In one embodiment, the number of subcarriers allocated to the SSCH is predetermined and fixed, e.g., a certain percentage of the total system bandwidth. In another embodiment, the number of subcarriers allocated to the SSCH is variable and may be conveyed by a system control message. Typically, the number of subcarriers allocated to the SSCH varies at a slow rate, if at all. For both embodiments, the number of subcarriers to allocate to the SSCH may be determined based on the expected or actual signaling load on the SSCH.

The SSCH may carry multicast messages generated based on the coding techniques described herein. The SSCH may be sent on all or a subset of the assigned subcarriers.

FIG. 7 shows a specific signaling channel that may be used to send multicast messages. These multicast messages may also be sent in other signaling channels having other structures and/or implemented with other radio technologies, e.g., CDMA.

Figure 8:
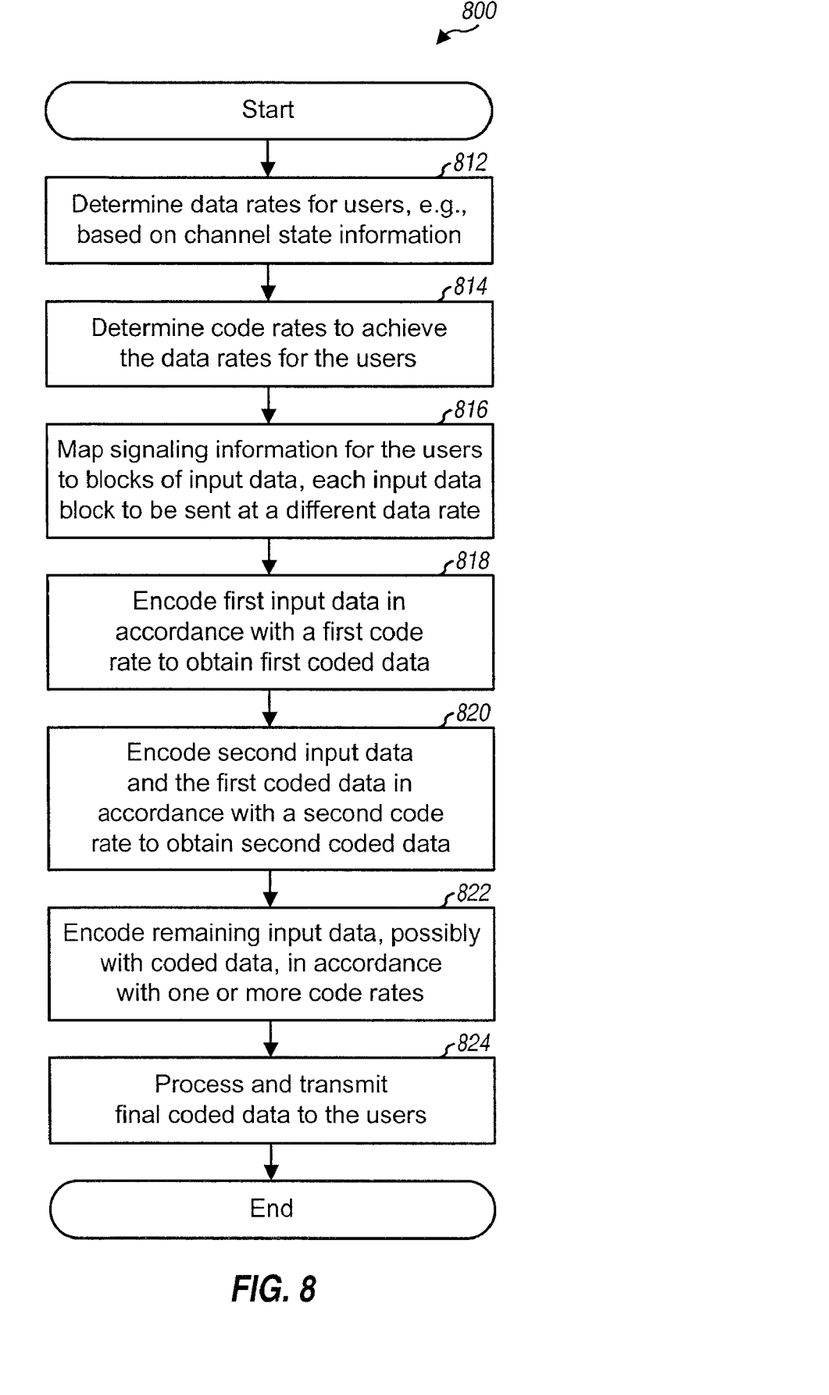
FIG. 8 shows a process for performing hierarchical coding.

FIG. 8 shows an embodiment of a process 800 for performing hierarchical coding at a transmitter. Data rates for users are determined, e.g., based on channel state information for the users (block 812). Code rates to achieve the data rates for the users are determined, e.g., as shown in equation (4) or (6) (block 814). Each data rate is determined by one or more code rates. Signaling information for the users and/or other information may be mapped to blocks of input data, with each input data block being sent at a different data rate (block 816). The signaling information for each user may also be scrambled with a scrambling code prior to being mapped to an input data block.

First input data (e.g., from one block) is encoded in accordance with a first code rate to obtain first coded data (block 818). Second input data (e.g., from another block) and the first coded data are encoded in accordance with a second code rate to obtain second coded data (block 820). The second input data and the first coded data may be (a) encoded jointly to obtain one block of second coded data or (b) encoded separately to obtain two blocks of second coded data. The first input data may be sent at a first data rate determined by the first and second code rates. The second input data may be sent at a second data rate determined by the second code rate.

The remaining input data (if any) is encoded, possibly with coded data, in accordance with one or more code rates (block 822). For the parallel architecture shown in FIG. 3A, third input data (e.g., from yet another block) may be encoded in accordance with a third code rate to obtain third coded data. The third coded data may then be encoded jointly or separately along with the second input data and the first coded data to obtain the second coded data. For the serial architecture shown in FIG. 3B, third input data and the second coded data may be encoded in accordance with a third code rate to obtain third coded data. In general, the data rate for each input data block is determined by all code rate(s) observed by that input data block. Final coded data is generated for all users and is further processed and transmitted (block 824).

Figure 9:
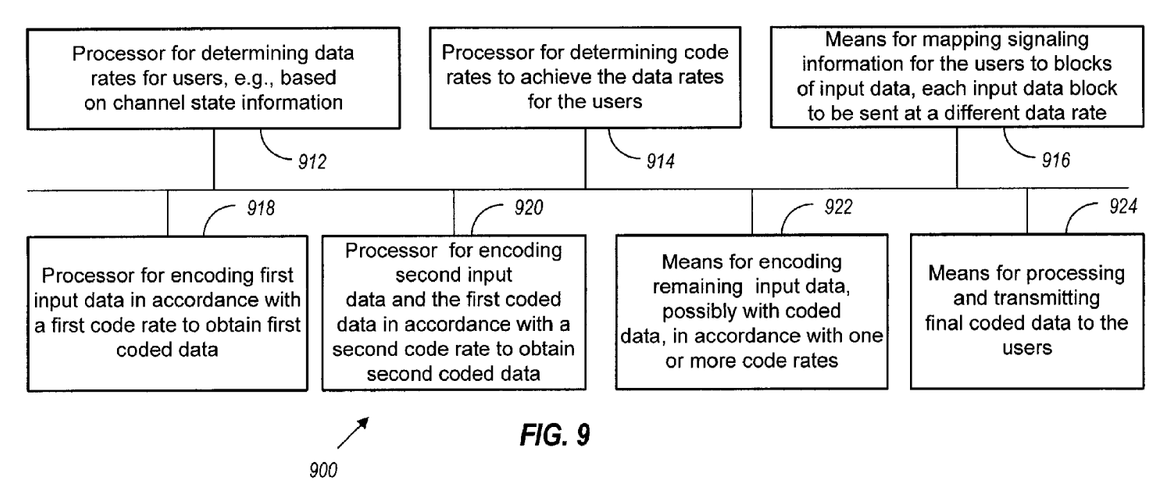
FIG. 9 shows an apparatus for performing hierarchical coding.

FIG. 9 shows an embodiment of an apparatus 900 for performing hierarchical coding. Apparatus 900 includes processor 912 for determining data rates for users, e.g., based on channel state information for the users, processor 914 for determining code rates to achieve the data rates for the users, processor 916 for mapping signaling information for the users to blocks of input data to be sent at different data rates, processor 918 for encoding first input data in accordance with a first code rate to obtain first coded data, processor 920 for encoding second input data and the first coded data in accordance with a second code rate to obtain second coded data, processor 922 for encoding remaining input data (if any) possibly with coded data in accordance with one or more code rates, and processor 924 for processing and transmitting final coded data generated for all users.

In FIG. 9, each processor may comprise one or more processors. The functions described with respect to each processor may be combinations of those described above with any of the FIGS. 1-8 above, with respect to encoding.

Figure 10:
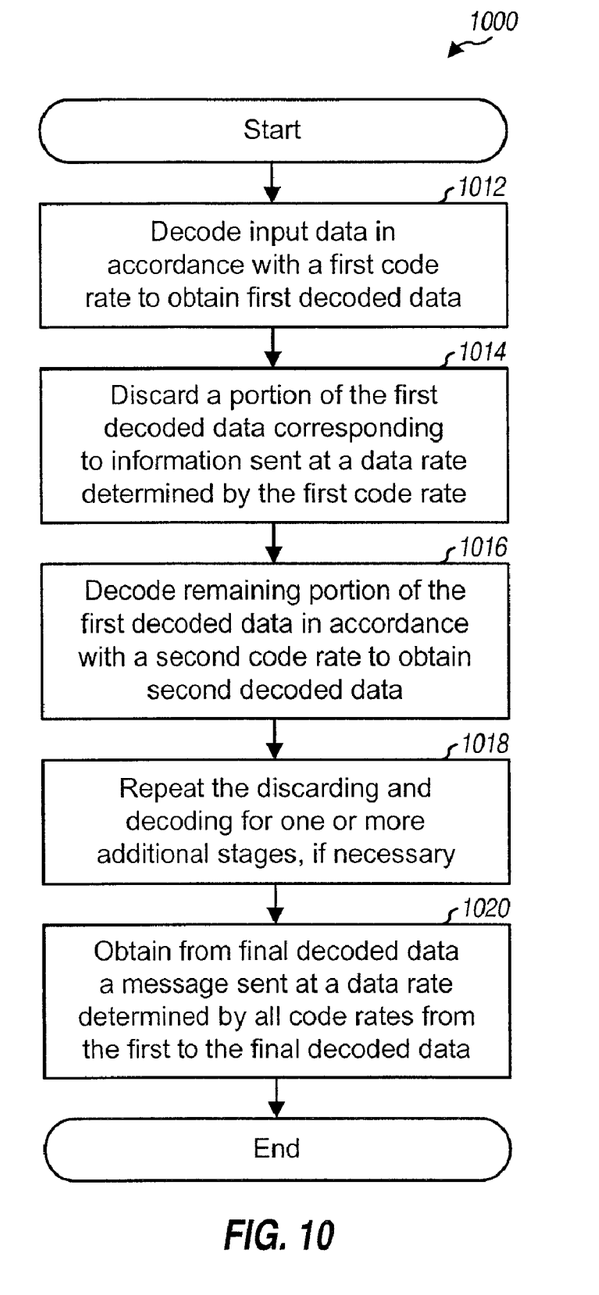
FIG. 10 shows a process for performing hierarchical decoding.

FIG. 10 shows an embodiment of a process 1000 for performing hierarchical decoding at a receiver. Input data (e.g., for a multicast message) is decoded in accordance with a first code rate to obtain first decoded data (block 1012). A portion of the first decoded data, which corresponds to information sent at a data rate determined by the first code rate, is discarded (block 1014). The remaining portion of the first decoded data is decoded in accordance with a second code rate to obtain second decoded data (block 1016). The discarding and decoding may be repeated for one or more additional stages, if necessary (block 1018). A desired message is obtained from final decoded data (block 1020). This message is sent at a data rate determined by all code rates from the first decoded data to the final decoded data. For the parallel architecture shown in FIG. 3A, a desired message sent at a data rate determined by the first and second code rates may be obtained from the second decoded data. For the serial architecture shown in FIG. 3B, a portion of the second decoded data may be decoded in accordance with a third code rate to obtain third decoded data, and a portion of the third decoded data may be further decoded. Iterative decoding or joint decoding may also be performed to recover the desired message.

Figure 11:
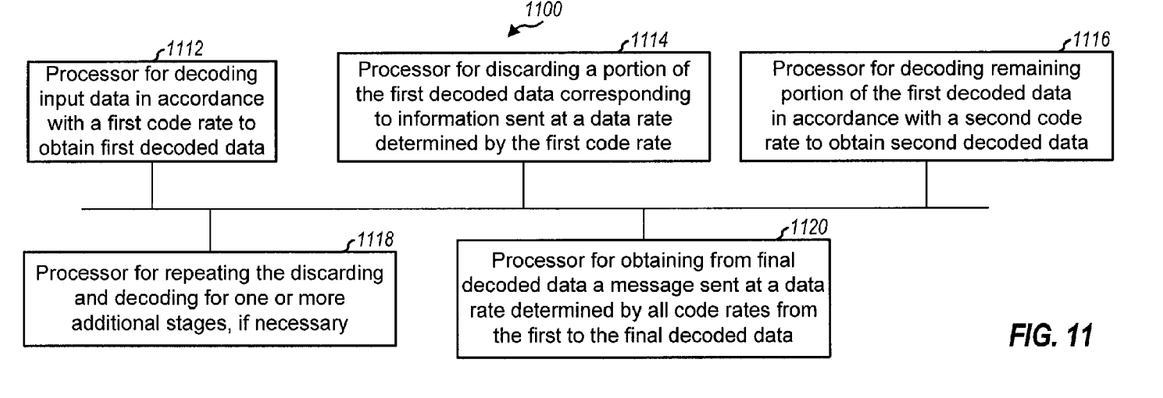
FIG. 11 shows an apparatus for performing hierarchical decoding.

FIG. 11 shows an embodiment of an apparatus 1100 for performing hierarchical decoding. Apparatus 1100 includes processor 1112 for decoding input data (e.g., for a multicast message) in accordance with a first code rate to obtain first decoded data, processor 1114 for discarding a portion of the first decoded data corresponding to information sent at a data rate determined by the first code rate, processor 1116 for decoding the remaining portion of the first decoded data in accordance with a second code rate to obtain a second decoded data, processor 1118 for repeating the discarding and decoding for one or more additional stages, if necessary, and processor 1120 for obtaining a desired message from final decoded data.

In FIG. 11, each processor may comprise one or more processors. The functions described with respect to each processor may be combinations of those described above with any of the FIGS. 1-8 above, with respect to decoding.

The coding techniques described herein may provide various benefits. The techniques enable efficient packing of individual messages intended for different users into a single multicast message with flexible resource allocation and rate adaptation. The message for each user may be encoded to achieve the desired data rate for that user. Higher coding gains may be achieved for the multicast message, especially when the individual messages are short. System resources (e.g., bandwidth) allocated for the transmission of the multicast message are shared by all of the users. This may improve resource utilization due to statistical multiplexing gains and may further improve the diversity observed by each user. Each user is allocated a portion of the resources used for the multicast message based on the amount of data to send to that user. Resources may thus be allocated to the users in finer granularity due to the aggregation of the messages for all users. Interference among the users may also be reduced. Each user may decode the multicast message and extract the message intended for that user.

The coding techniques described herein may be implemented by various means. For example, these techniques may be implemented in hardware, firmware, software, or a combination thereof. For a hardware implementation, the processing units used to perform encoding at a transmitter (e.g., hierarchical encoder 310, 330 or 350 in FIG. 3A, 3B or 3C) may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof. The processing units used to perform decoding at a receiver (e.g., hierarchical decoder 530 or 630 in FIG. 5 or 6B) may also be implemented within one or more ASICs, DSPs, processors, and so on. The processing units (e.g., processors) may be coupled to one or more memories, e.g., solid-state memories, which may store data and/or program codes.

For a firmware and/or software implementation, the coding techniques may be implemented with codes (e.g., procedures, functions, and so on) that cause one or more processors to perform the functions described herein. The firmware and/or software codes may be stored in a memory (e.g., memory 232 or 272 in FIG. 2) and executed by a processor (e.g., processor 230 or 270). The memory may be implemented within the processor or external to the processor.

Further, for software implementations, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus comprising:
   at least one processor configured
   to encode first input data for a first user in accordance with a first code rate to obtain first coded data, and
   to jointly encode second input data for a second user with the first coded data in accordance with a second code rate to obtain second coded data; and
   a memory coupled to the at least one processor, wherein the at least one processor is configured to encode third input data and the second coded data in accordance with a third code rate to obtain third coded data, wherein the first input data is sent at a first data rate determined by the first, second and third code rates, wherein the second input data is sent at a second data rate determined by the second and third code rates, and wherein the third input data is sent at a third data rate determined by the third code rate.

2. The apparatus of claim 1, wherein the first input data is sent at a first data rate determined by the first and second code rates, and wherein the second input data is sent at a second data rate determined by the second code rate.

3. The apparatus of claim 1, wherein the at least one processor is configured
   to encode the first coded data in accordance with the second code rate to obtain a first block of second coded data, and
   to encode the second input data in accordance with the second code rate to obtain a second block of second coded data.

4. The apparatus of claim 1, wherein the at least one processor is configured to jointly encode the second input data and the first coded data in accordance with the second code rate to obtain one block of second coded data.

5. The apparatus of claim 1, wherein the at least one processor is configured to encode third input data and the second coded data in accordance with a third code rate to obtain third coded data.

6. The apparatus of claim 1, wherein the at least one processor is configured
   to encode third input data in accordance with a third code rate to obtain third coded data and
   to encode the second input data and the first and third coded data in accordance with the second code rate to obtain the second coded data.

7. An apparatus comprising:
   at least one processor configured
   to encode first input data for a first user in accordance with a first code rate to obtain first coded data, and to jointly encode second input data for a second user with the first coded data in accordance with a second code rate to obtain second coded data; and a memory coupled to the at least one processor, wherein the at least one processor is configured to encode third input data in accordance with a third code rate to obtain third coded data and to encode the second input data and the first and third coded data in accordance with the second code rate to obtain the second coded data, and wherein the first input data is sent at a first data rate determined by the first and second code rates, wherein the second input data is sent at a second data rate determined by the second code rate, and wherein the third input data is sent at a third data rate determined by the second and third code rates.

8. The apparatus of claim 1, wherein the at least one processor is configured
to encode the first input data with a base code and
to puncture an output of the base code with a puncture pattern for the first code rate to obtain the first coded data.

9. The apparatus of claim 8, wherein the base code comprises a convolutional code, a Turbo code, or a block code.

10. The apparatus of claim 1, the first input data comprising signaling information for the first user, the second input data comprising signaling information for the second user.

11. The apparatus of claim 10, wherein the signaling information indicates allocation of resources for the first and second users.

12. The apparatus of claim 10, wherein the at least one processor is configured to scramble the signaling information for each user with a scrambling code for the user prior to encoding.

13. The apparatus of claim 1, wherein the at least one processor is configured
to determine a plurality of data rates for a plurality of users, and
to determine a plurality of code rates to achieve the plurality of data rates, the plurality of code rates including the first and second code rates.

14. The apparatus of claim 13, wherein the at least one processor is configured
to determine the plurality of data rates based on channel state information for the plurality of users, and
to map signaling information for each user to one of a plurality of input data blocks based on a data rate for the user, the plurality of input data blocks comprising the first and second input data.

15. A method comprising:
encoding first input data for a first user in accordance with a first code rate to obtain first coded data;
jointly encoding second input data for a second user with the first coded data in accordance with a second code rate to obtain second coded data;
jointly encoding third input data for a third user with the second coded data in accordance with a third code rate;
sending the first input data at a first data rate determined by the first, second and third code rates;
sending the second input data at a second data rate determined by the second and third code rates; and
sending the third input data at a third data rate determined by the third code rate.

16. The method of claim 15, wherein the encoding the first input data comprises
encoding the first input data with a base code, and
puncturing an output of the base code with a puncture pattern for the first code rate to obtain the first coded data.

17. The method of claim 15, further comprising:
determining a plurality of data rates for a plurality of users; and
determining a plurality of code rates to achieve the plurality of data rates, the plurality of code rates including the first and second code rates.

18. The method of claim 15, the first input data comprising signaling information for the first user, the second input data comprising signaling information for the second user.

19. An apparatus comprising:
means for encoding first input data for a first user in accordance with a first code rate to obtain first coded data;
means for jointly encoding second input data for a second user with the first coded data in accordance with a second code rate to obtain second coded data; and
means for jointly encoding third input data for a third user with the second coded data in accordance with a third code rate to obtain third coded data.

20. The apparatus of claim 19, wherein the means for encoding the first input data comprises
means for encoding the first input data with a base code, and
means for puncturing output of the base code with a puncture pattern for the first code rate to obtain the first coded data.

21. The apparatus of claim 19, further comprising:
means for determining a plurality of data rates for a plurality of users; and
means for determining a plurality of code rates to achieve the plurality of data rates, the plurality of code rates including the first and second code rates.

22. The apparatus of claim 19, the first input data comprising signaling information for the first user, the second input data comprising signaling information for the second user.

23. A computer program product comprising:
a computer storage device storing:
code for encoding first input data for a first user in accordance with a first code rate to obtain first coded data;
code for jointly encoding second input data for a second user with the first coded data in accordance with a second code rate to obtain second coded data; and
code for jointly encoding third input data for a third user with the second coded data in accordance with a third code rate to obtain third coded data.

* * * * *